United States Patent
Stuhlberger et al.

(10) Patent No.: US 9,219,487 B1
(45) Date of Patent: Dec. 22, 2015

(54) FREQUENCY RAMP GENERATION IN PLL BASED RF FRONTEND

(71) Applicant: Infineon Technologies AG, Neubiberg (DE)

(72) Inventors: Rainer Stuhlberger, Puchenau (AT); Klemens Kordik, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/472,431

(22) Filed: Aug. 29, 2014

(51) Int. Cl.
*H03L 7/197* (2006.01)
*H03C 3/09* (2006.01)
*H03L 7/085* (2006.01)
*G01S 13/88* (2006.01)

(52) U.S. Cl.
CPC ............ *H03L 7/1976* (2013.01); *H03C 3/0933* (2013.01); *H03L 7/197* (2013.01); *H03L 7/1974* (2013.01); *G01S 13/88* (2013.01); *H03L 7/085* (2013.01)

(58) Field of Classification Search
CPC ..... H03L 7/1976; H03L 7/1974; H03L 7/085; H03L 7/193; H03L 7/197; H03C 3/0933; H01S 13/34; H01S 13/343; H01S 13/88; H03B 23/00
See application file for complete search history.

(56) References Cited

U.S. PATENT DOCUMENTS

| | | | |
|---|---|---|---|
| 6,836,526 B2 * | 12/2004 | Rana ................................ 377/47 |
| 2006/0273255 A1 * | 12/2006 | Volkov et al. ............... 250/336.1 |
| 2008/0079510 A1 * | 4/2008 | Seethamraju et al. ........ 331/179 |
| 2011/0096241 A1 * | 4/2011 | Ahluwalia et al. ............ 348/726 |
| 2011/0298506 A1 * | 12/2011 | Salle et al. ..................... 327/156 |
| 2012/0062297 A1 * | 3/2012 | Keaveney et al. ............. 327/159 |
| 2012/0068742 A1 * | 3/2012 | Kuo et al. ...................... 327/156 |

OTHER PUBLICATIONS

Analog Devices, Inc., Fundamentals of Phase Locked Loops (PLLs), Analog Devices, MT-086 Tutorial, 10 pages, 2009, available at http://www.analog.com/media/en/training-seminars/tutorials/MT-086.pdf, last accessed Mar. 27, 2015.*

* cited by examiner

*Primary Examiner* — Chieh M Fan
*Assistant Examiner* — Michelle M Koeth
(74) *Attorney, Agent, or Firm* — Eschweiler & Associates, LLC

(57) ABSTRACT

An RF transceiver circuit is disclosed herein. In accordance with one example of the disclosure the RF transceiver circuit includes a phase-locked-loop (PLL) with a fractional-N multi-modulus divider. The PLL operates in accordance with a PLL clock frequency and generates a frequency modulated RF output signal. The RF transceiver circuit further includes a modulator unit, which is configured to generate a sequence of division values dependent on a set of modulation parameters. The modulator operates in accordance with a system clock frequency, which is lower than the PLL clock frequency. A sample rate conversion unit is coupled between the modulator unit and a fractional-N multi-modulus divider. The sample rate conversion unit is configured to interpolate the sequence of division ratios to provide an interpolated sequence of division ratios at a rate corresponding to the PLL clock frequency.

14 Claims, 5 Drawing Sheets

FREQUENCY RAMP GENERATION IN PLL BASED RF FRONTEND

FIELD

The present disclosure relates to the field of radio frequency (RF) transmitter or transceiver circuits.

BACKGROUND

Radio frequency (RF) transceivers can be found in numerous applications, particularly in the field of wireless communications and radar sensors. In the automotive sector, there is an increasing demand for radar sensors used in so-called "adaptive cruise control" (ACC) or "radar cruise control" systems. Such systems may be used to automatically adjust the speed of an automobile so as to maintain a safe distance from other automobiles ahead.

Modern radar systems make use of highly integrated RF circuits, which may incorporate all core functions of an RF front-end of a radar transceiver in one single package (single chip transceiver). Such RF front-ends usually include, inter alia, a voltage controlled oscillator (VCO), power amplifiers (PA), mixers, and analog-to-digital converters (ADC).

Frequency Modulated Continuous Wave (FMCW) radar systems use radar signals whose frequency is modulated by ramping the signal frequency up and down. Such radar signals are often referred to as "chirp signals" or simply as chirps, wherein frequency is ramped up in an up-chirp and ramped down in a down-chirp. For generating such chirp signals the radar transmitter may include a voltage controlled oscillator (VCO) which is controlled by a digital-analog-converter (DAC). That is, the frequency ramp is generated in the digital domain, the digital values are converted to an analog control signal, which controls the frequency of the VCO. However, such an implementation usually requires a high precision DAC as well as a frequency stabilization (in view of temperature drift and parameter variations due to the manufacturing process). Alternatively, the VCO may be operated in a phase-locked loop (PLL) including a multi-modulus frequency divider. In such an implementation, the frequency is modulated by appropriately tuning the division ratio of the multi-modulus frequency divider. In practice, fractional-N frequency dividers may be used, which allow to digitally set a rational (non-integer) number as division ratio. However, the division ratio should be adjusted in each clock cycle of the PLL. As the PLL usually operates at comparably high frequencies (and therefore the PLL clock cycle is comparably short) a fully digital control of the division ratio is resource-intensive and thus difficult to implement. Therefore, there is a need for an improved frequency ramp-generation in PLL based RF frontends.

SUMMARY

An RF transceiver circuit is disclosed herein. In accordance with one example of the disclosure the RF transceiver circuit comprises a phase-locked-loop (PLL) with a fractional-N multi-modulus divider. The PLL operates in accordance with a PLL clock frequency and generates a frequency modulated RF output signal. The RF transceiver circuit further comprises a modulator unit, which is configured to generate a sequence of division values dependent on a set of modulation parameters. The modulator operates in accordance with a system clock frequency, which is lower than the PLL clock frequency. A sample rate conversion unit is coupled between the modulator unit and a the fractional-N multi-modulus divider. The sample rate conversion unit is configured to interpolate the sequence of division ratios to provide an interpolated sequence of division ratios at a rate corresponding to the PLL clock frequency.

BRIEF DESCRIPTION OF THE DRAWINGS

The disclosure can be better understood with reference to the following drawings and descriptions. The components in the figures are not necessarily to scale; in-stead emphasis is placed upon illustrating the principles of the disclosure. More-over, in the figures, like reference numerals designate corresponding parts. In the drawings.

DETAILED DESCRIPTION

Figure 1:
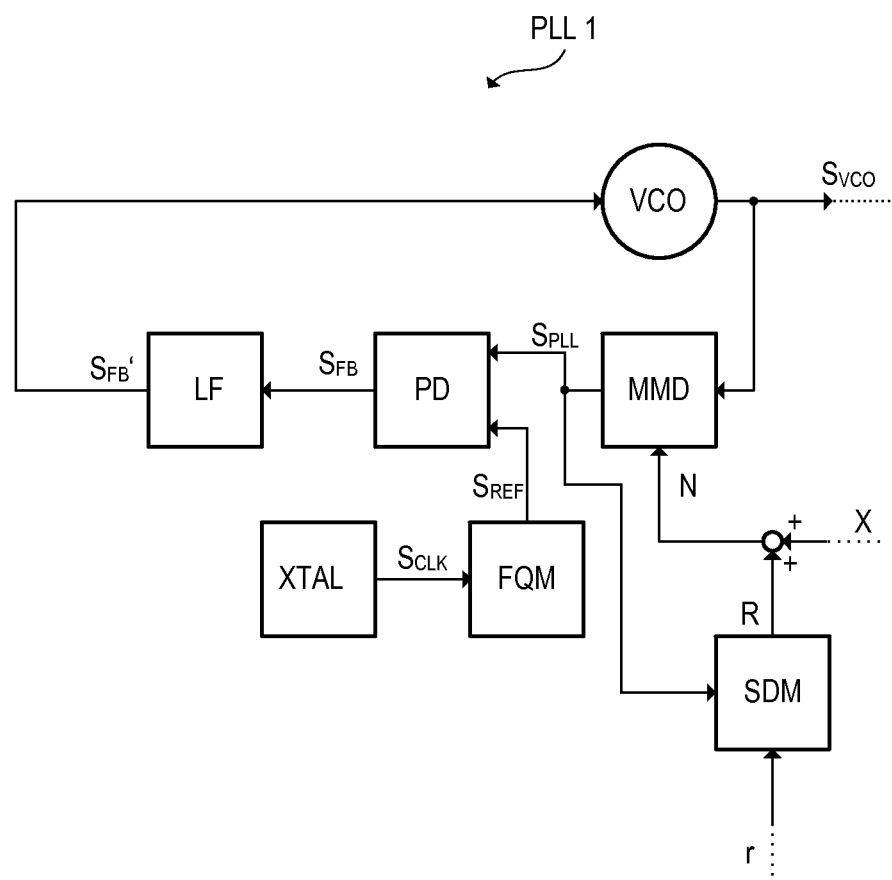
FIG. 1 is a block diagram illustrating one exemplary implementation of a phase-locked loop (PLL)

FIG. 1 illustrates one example of a phase locked loop (PLL) 1 that uses a fractional-N multi-modulus frequency divider, which includes a Σ-Δ modulator to continuously alter the (integer) frequency division modulus so as to accomplish a rational number as effective frequency division modulus. The basic principle of such a PLL is as such known and described, e.g., in Tom A. D. Riley: Delta-Sigma Modulation in Fractional-N Frequency Synthesis, in: IEEE Journal of Solid-State Circuits, vol. 28, no. 5, May 1993, which shall be incorporated herein by reference.

The PLL 1 includes an voltage controlled oscillator VCO (or, in a fully digital implementation a numerically controlled oscillator, short: NCO) which generates an oscillating output signal $S_{VCO}$ having an frequency denoted as $f_{VCO}$, which is set in accordance with a control input of the oscillator VCO (oscillator control signal $S_{CTRL}$). The oscillating output signal $S_{VCO}$ is supplied to a frequency divider MMD having a selectable (integer) division ratio N. That is, the frequency divider MMD is configured to divide the frequency supplied to its input and to generate a divider output signal $S_{PLL}$ having a frequency denoted as $f_{PLL}$, wherein $f_{VCO}=N \cdot f_{PLL}$. The division ratio N is selectable dependent on a signal supplied to a select input of the frequency divider MMD. The output signal $S_{PLL}$ of the frequency divider MMD is also referred to as PLL clock signal. In a radar application the RF oscillator frequency $f_{VCO}$ may be between 76 GHz and 81 GHz, while the PLL clock signal $S_{PLL}$ may have a PLL clock frequency $f_{PLL}$ in a range from 160 MHz to 200 MHz.

The frequency divider output signal $S_{PLL}$ as well as a reference signal $S_{REF}$, which has a frequency $f_{REF}$, are supplied to a phase detector PD (also known as phase comparator). Dependent on the implementation a phase-frequency-detector PFD may be employed instead. Phase detectors as well as phase-frequency detectors are commonly used in the field of PLLs and therefore not further discussed in more detail.

In the present example, the reference signal $S_{REF}$ may be provided by a frequency multiplier FQM, which is configured to multiply the frequency $f_{CLK}$ (also referred to as system clock frequency) of a reference oscillator XTAL, which usually is (but not necessarily has to be) a crystal oscillator. That is, the frequency $f_{REF}$ may be (indirectly) determined by the resonance frequency of a quartz crystal oscillator. Alternatively, the reference signal $S_{REF}$ may directly be provided by the reference oscillator XTAL without any frequency multiplication. The reference frequency $f_{REF}$ may be, for example, in a range between 160 MHZ and 200 MHz, while the system clock frequency $f_{CLK}$ provided by the reference oscillator XTAL is, for example, in the range from 40 MHz to 80 MHz. In the present examples, the frequency multiplier FQM uses a multiplication factor between 2 and 5. However different multiplication factors and frequency values for $f_{CLK}$, $f_{PLL}$, and $f_{VCO}$ may be used, dependent on the application.

The output signal $S_{FB}$ of the phase (-frequency) detector P(F)D usually includes a charge-pump at its output, which generates (as output signal $S_{FB}$) an error signal that is filtered by a loop filter LF, which determines the bandwidth of the control loop. The charge pump usually drives a current signal to the loop filter. The output signal of the loop filter LF is used as control signal $S_{CTRL}$ to adjust the oscillation frequency $f_{VCO}$ of the oscillator VCO, thus closing the control loop. The closed loop ensures that the frequency $f_{VCO}$ is continuously tuned to such a value that the phases of the divider output signal $S_{PLL}$ and the reference signal $S_{REF}$ match. Various implementations of phase (-frequency) detector P(F)D including charge-pumps are as such known in the art and thus not further discussed herein in more detail.

Generally, the division ratio N used by the frequency divider MMD is an integer number. To accomplish a non-integer division ratio, the integer ratio N may be modulated by a Σ-Δ modulator SDM such that the average (and effective) division ratio is a rational number. The Σ-Δ modulator SDM is clocked by the PLL clock signal $S_{PLL}$ (clock frequency $f_{PLL}$) and is supplied with a (e.g. digital) input value r which represents a fraction between 0 and 1. For example, assuming r is a 3-bit number r can assume the following values: 0, ⅛, ¼, ⅜, ½, ⅝, ¾, and ⅞. The values R generated at the output of the Σ-Δ modulator SDM are integer values having an average value equal to the input value r. An integer offset value X may be added to the modulator output signal R (N=X+R). The sum value N equals—on average—X+r, and is then supplied to the divider MMD, which sets the division ratio in accordance to the sum value N. That is, the divider MMD receives an updated division ratio N each clock cycle of $S_{PLL}$ in accordance with the modulator output. Due to the Σ-Δ modulation the average division ratio is X+r, i.e. an integer ratio X augmented by a fractional value r. Alternatively, the integer offset may be already included in the input value r. In this case, r is not a fraction between 0 and 1 but rather a rational number within a specific interval (e.g. the interval [2, 8]).

It should be noted that r does not necessarily have to be a rational number between 0 and 1. Other intervals, e.g. 0 to 2 may be applicable and depend on the actual design of the Σ-Δ modulator SDM and the PLL. Usually Σ-Δ modulators are used which have a 3$^{rd}$ order MASH (multi stage noise shaping) structure, also referred to as MASH3 modulator. Further, the input value r supplied to the Σ-Δ modulator does not necessarily have to cover the full range of values which theoretically would be possible. In the example of FIG. 1, r can assume any value between 0 and 1. Alternatively, the interval from 0 to 1 may be discretized such that, for example, r can vary from 0 to 25/26 in steps of 1/26. In this case, r would be a 5-bit number whereby only 26 of the 32 possible values are actually used.

As mentioned above, a frequency modulation of the RF oscillator signal $S_{VCO}$ may be accomplished by appropriately tuning the (effectively rational) division ratio N used by the frequency divider MMD. In radar applications, frequency modulation is particularly used to generate so-called chirp signals (also known as sweep signals). A chirp signal, or simply a chirp, is a signal, in which the frequency increases ("up-chirp") or decreases ("down-chirp") over time. Chirp signals are commonly used in sonar and radar applications, but also in other applications, such as in spread spectrum communications. In practice the frequency variation may be linear (linear chirp, frequency ramp), exponential (exponential chirp) or hyperbolic (hyperbolic chirp).

One efficient way to generate a frequency modulated RF oscillator signal $S_{VCO}$ is to appropriately vary the (rational) division ratio X+r of the fractional-N frequency divider. However, the Σ-Δ modulator SDM operates at the frequency $f_{PLL}$ of the PLL clock signal $S_{PLL}$ (wherein $f_{PLL}$ is in the 100 MHz range, e.g. between 160 MHz and 200 MHz), and thus the frequency ramp (chirp) generator has to continuously provide input data (current division ratio) at the same rate (corresponding to $f_{PLL}$), which is resource-intensive and thus difficult to implement and further requires a large chip area and is inefficient due to high power consumption.

Figure 2:
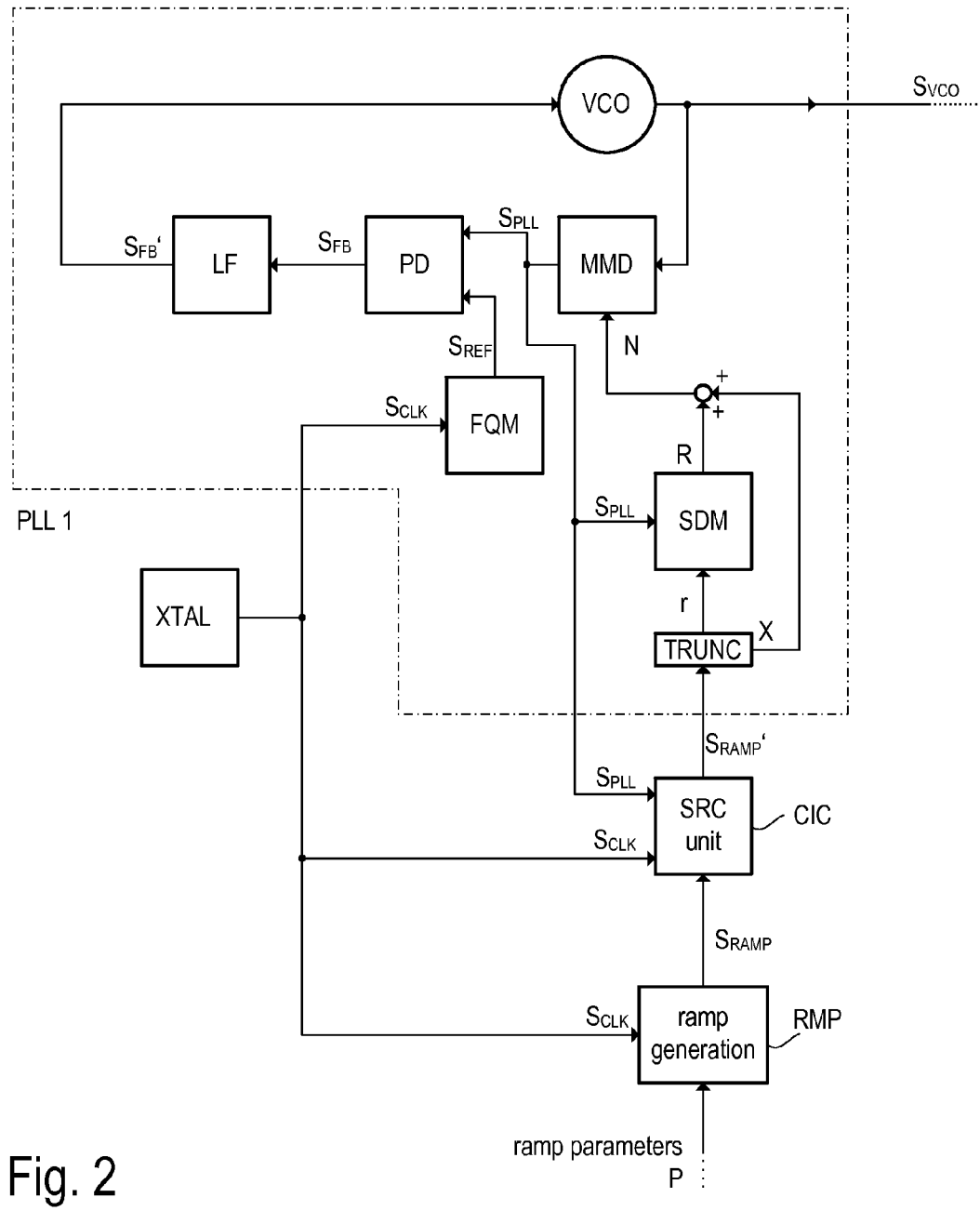
FIG. 2 is a block diagram illustrating an RF frontend including a PLL in accordance with FIG. 1 and a ramp generator for generating chirp signals.

FIG. 2 illustrates a PLL 1 in accordance with the example of FIG. 1 with an additional modulator unit that is operated at a clock frequency $f_{CLK}$ (e.g. 40 MHz to 80 MHz) lower than the PLL clock frequency $f_{PLL}$ (160 MHz to 200 MHz). In the examples described herein, the modulator unit is a ramp generator RMP for generating frequency ramps (linear chirps). However, other types of frequency modulations may be accomplished by other modulator units. A sample rate conversion unit SRC is used to couple the modulator unit (i.e. the ramp generator RMP) and the PLL 1. The ramp generator RMP is clocked with the (lower) clock frequency $f_{CLK}$ provided by the reference oscillator XTAL, while the sample rate conversion unit SRC and the Σ-Δ modulator SDM of the PLL 1 are clocked with the (higher) PLL clock frequency $f_{PLL}$.

According to the example of FIG. 2, the ramp generator RMP receives modulation parameters P (ramp parameters) that define the frequency modulation of the RF oscillator signal $S_{VCO}$. The modulation parameters particularly include the start frequency $f_{START}$ and the stop frequency $f_{STOP}$ as well as further parameters defining the shape of the modulation. In case of a linear chirp the further parameters may include, for example, the time $T_{CHIRP}$ needed for ramping up (or down) the frequency from $f_{START}$ to $f_{STOP}$ (see FIG. 3) Alternatively, the start frequency $f_{START}$ and the frequency change rate df/dt may be specified. Based on these modulation parameters P the ramp generator RMP calculates corresponding division ratios $S_{RAMP}$ in each clock cycle of the reference clock signal $S_{CLK}$. For a clock frequency $f_{CLK}$ of 40 MHz one clock cycle is 25 nanoseconds. Accordingly the sequence $S_{RAMP}$ is a sequence of (non-integer) division ratios, wherein a new division ratio is calculated in each clock cycle of the reference clock signal $S_{CLK}$.

The resulting sequence is then supplied to the sample-rate conversion unit SRC which may include a simple cascaded integrator-comb (CIC) filter. CIC filters are as such known and commonly used for sample rate conversion and thus not further discussed here. Generally, CIC filters are finite-impulse response (FIR) filters used in multi-rate signal processing for the interpolation and decimation of discrete time signals. The sample-rate conversion unit SRC receives, at its input, the sequence $S_{RAMP}$ at a rate corresponding to the lower clock frequency $f_{CLK}$ and provides, at its output, an interpolated sequence $S_{RAMP}'$ at the (higher) PLL clock frequency $f_{PLL}$. The interpolation ratio is thereby fixed and corresponds to the multiplication factor used by the frequency multiplicator FQM. In case of a clock frequency $f_{CLK}$ of 40 MHz (provided by oscillator XTAL), a PLL clock frequency $f_{PLL}$ of 200 MHz (corresponds to an interpolation ratio of 5), and an RF oscillator frequency $f_{VCO}$ between 76 GHz and 81 GHz, the frequency division ratios in the sequence $S_{RAMP}'$ are between 380 and 405.

In the present example, the (interpolated) sequence $S_{RAMP}'$ of division ratios is supplied to the PLL 1. The numbers included in the sequence $S_{RAMP}'$ are split into an integer number X and non-integer number r (wherein $S_{RAMP}'=X+r$) by the truncation unit TRUNC. The non-integer number r is supplied to the Σ-Δ modulator SDM, which provides the modulated sequence R. As already discussed in the example of FIG. 1 the sum R+X is an integer number and supplied to the multi-modulus divider MMD of the PLL 1. The components and the function of the PLL 1 is identical to the previous example of FIG. 1 and thus not repeated here.

Figure 3:
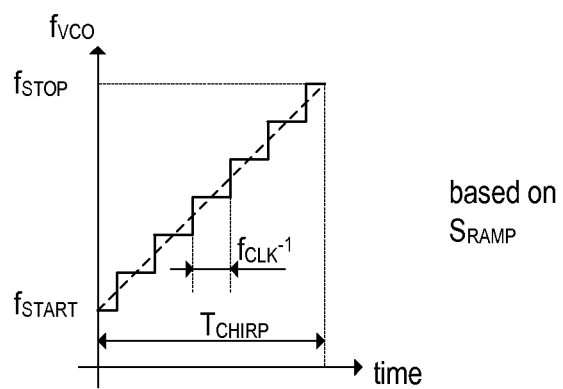
FIG. 3 illustrates the frequency ramps for lower and higher clock rates.
Figure 3:
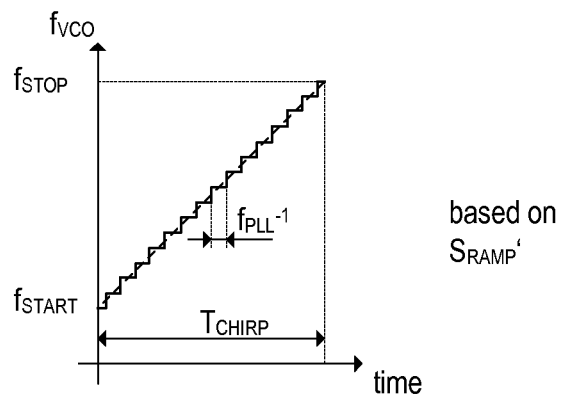

FIG. 3 illustrates by means of timing diagrams the interpolation of the sequence $S_{RAMP}$, which is composed of calculated division ratios used by the PLL 1 for generating a chirp signal at the output of the voltage-controlled oscillator VCO. The upper diagram illustrates a "coarse" (coarsely quantized) ramp as generated based on the sequence $S_{RAMP}$ provided by the ramp generator RMP, wherein one division ratio value is cyclically generated in cycles corresponding to the clock frequency $f_{CLK}$. The present example illustrates an up-chirp having a length $T_{CHIRP}$, starting at a frequency $f_{START}$, and stopping at $f_{STOP}$. The lower diagram illustrates a "fine" ramp as generated based on the sequence $S_{RAMP}'$ provided by the sample rate conversion unit SRC, wherein one division ratio value is cyclically generated in cycles corresponding to the PLL clock frequency $f_{PLL}$.

Figure 4:
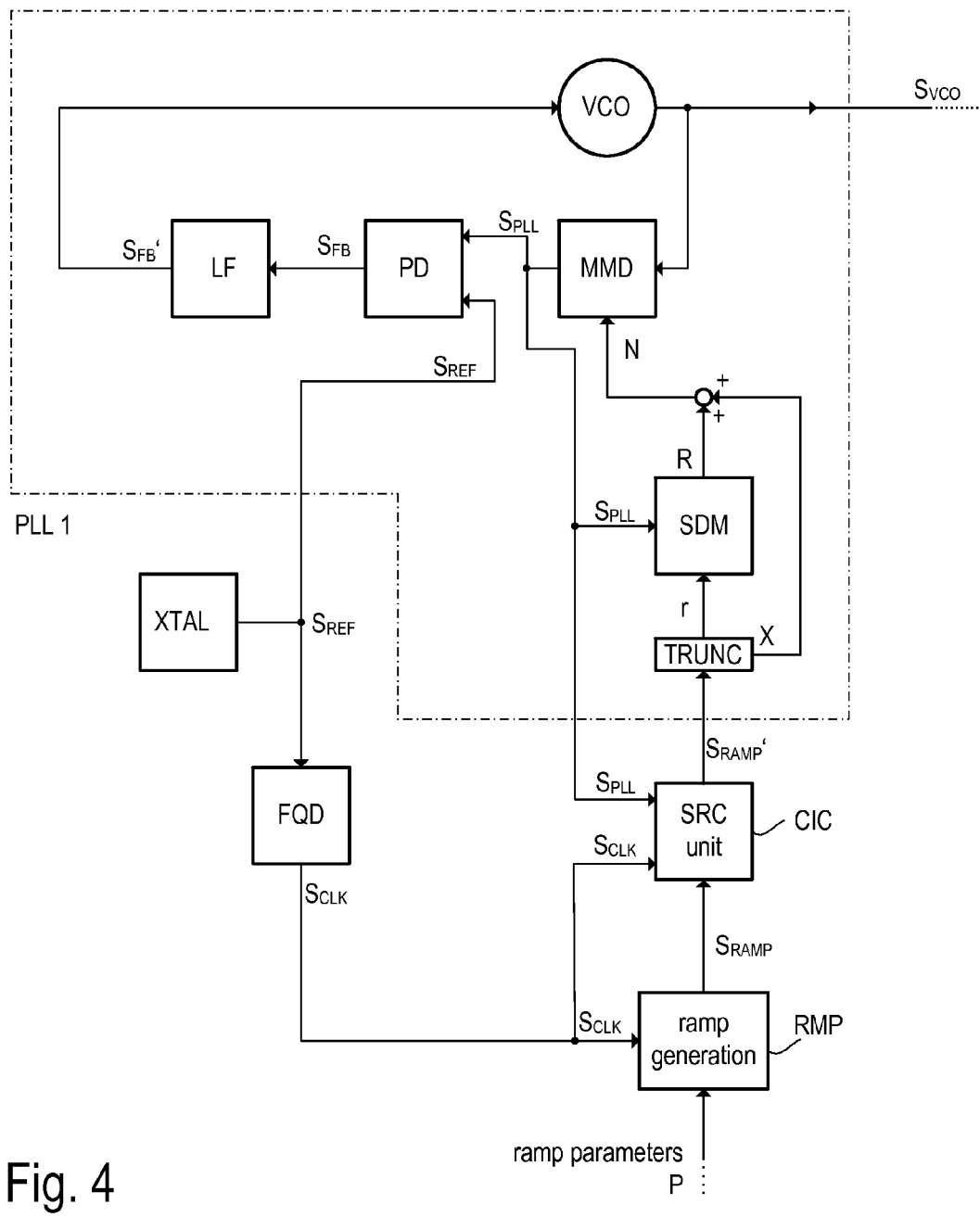
FIG. 4 is a block diagram illustrating an RF frontend similar to FIG. 2; the frontend includes a PLL and a ramp generator for generating chirp signals.

FIG. 4 illustrates another example, which is identical to the example of FIG. 2 except that the reference signal $S_{REF}$ (used by the phase comparator PD of the PLL 1) is provided by a reference oscillator XTAL without a preceding frequency multiplication. As in the previous example of FIG. 2, this frequency $f_{REF}$ (and thus the PLL clock frequency $f_{PLL}$) may be between 160 MHz and 200 MHz. The clock signal $S_{CLK}$ with the lower frequency $f_{CLK}$ is obtained by dividing the frequency $f_{REF}$ of the reference signal $S_{REF}$ by a fixed predefined factor. As in the previous example of FIG. 2, the clock frequency $f_{CLK}$ may be between 40 MHz and 80 MHz. However, dependent on the application, the other frequency values and division rations may be used.

Figure 5:
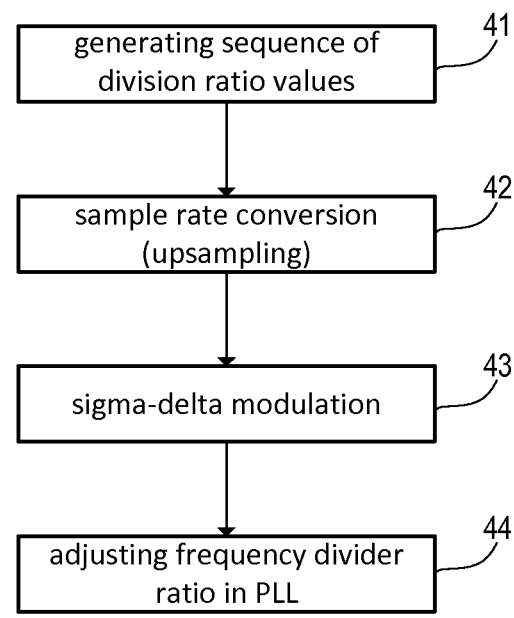
FIG. 5 illustrates one exemplary method for generating RF chirp signals.

A method for generating frequency modulated RF signals (as provided by the circuits of FIGS. 2 and 4) is summarized with reference to the flow chart of FIG. 5. The method makes use of a PLL (see FIG. 2, PLL 1) having a fractional-N multi-modulus frequency divider. In a first step (step 41) a sequence of divider ratios $S_{RAMP}$ is generated dependent on a set of ramp parameters P (see FIG. 2). The divider ratios are for the fractional-N frequency divider MMD of the PLL 1 and correspond to the desired modulation scheme (e.g. a linear chirp). The values included in the sequence $S_{RAMP}$ are generated in accordance with a comparably low clock frequency $f_{CLK}$. Subsequently (step 42), the sequence $S_{RAMP}$ is subject to a sample rate conversion to generate an upsampled (interpolated) sequence $S_{RAMP}'$ at a higher rate which corresponds to the PLL clock frequency $f_{PLL}$. As the sequence $S_{RAMP}'$ includes rational numbers as division ratios the upsampled sequence $S_{RAMP}'$ is then subject to a Σ-Δ modulation (step 43) to generate integer valued division ratios N (N=R+X, see FIGS. 2 and 4), which correspond—on average—to the rational values of sequence $S_{RAMP}'$. The PLL 1 as such operates as described with reference to FIG. 1. In particular, the frequency division ratio used by the multi-modulus divider of the PLL 1 is adjusted in each PLL clock cycle (step 44).

Due to the sample rate conversion only a few of system components need to operate at the high PLL clock frequency $f_{PLL}$. The ramp generation and all preceding signal processing steps may be processed at the lower system clock frequency $f_{CLK}$. Thus, the overall system complexity may be significantly reduced.

Although the disclosure has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An RF transceiver circuit, comprising:
    a phase-locked-loop (PLL) including a fractional-N multi-modulus divider, the PLL operating in accordance with a PLL clock frequency and generating a frequency modulated RF output signal;
    a modulator configured to generate a sequence of division ratios dependent on a set of modulation parameters, the modulator operating in accordance with a system clock frequency, which is lower than the PLL clock frequency; and
    a sample rate conversion unit coupled between the modulator and the fractional-N multi-modulus divider, the sample rate conversion unit being configured to interpolate the sequence of division ratios to provide an interpolated sequence of division ratios at a rate corresponding to the PLL clock frequency,
    wherein the sample rate conversion unit interpolates the sequence of division ratios by an interpolation factor corresponding to the ratio between the PLL clock frequency and the system clock frequency.

2. The RF transceiver circuit of claim 1, wherein the PLL clock frequency is an integer multiple of the system clock frequency.

3. The RF transceiver circuit of claim 1, further comprising:
    a reference oscillator that generates a system clock signal oscillating at the system clock frequency; and
    a frequency multiplier coupled to the reference oscillator and configured to multiply the system clock frequency to obtain a reference clock signal oscillating at a reference frequency.

4. The RF transceiver circuit of claim 3, wherein the frequency multiplier is configured to accomplish a frequency multiplication by a fixed integer multiple.

5. The RF transceiver circuit of claim 1 further comprising:
a reference oscillator that generates a system clock signal oscillating at a reference frequency; and
a frequency divider unit coupled to the reference oscillator and configured to divide the reference frequency to obtain a system reference clock signal oscillating at the system clock frequency.

6. The RF transceiver circuit of claim 5, wherein the frequency divider unit is configured to accomplish a frequency division in accordance with a fixed integer division ratio.

7. The RF transceiver circuit of claim 1, wherein the PLL is configured to regulate the PLL clock frequency to match a reference frequency.

8. The RF transceiver circuit of claim 1, wherein the sample rate conversion unit includes a multi-rate FIR filter.

9. The RF transceiver circuit of claim 8, wherein the multi-rate FIR filter is a cascaded integrator-comb (CIC) filter.

10. The RF transceiver unit of claim 1, wherein the modulation parameters represent a desired modulation scheme.

11. The RF transceiver unit of claim 1, wherein the modulator is a frequency ramp generator and the modulation parameters are indicative of at least one of the following: a start frequency of the ramp, a stop frequency of the ramp, and a duration of the ramp.

12. A method for generating a frequency modulated RF signal using a phase locked loop (PLL) with a fractional-N multi-modulus frequency divider, the method comprising:
generating a sequence of frequency division ratios in accordance with a set of modulation parameters, the sequence of frequency division ratios being generated at a rate corresponding to a system clock frequency;
upsampling the sequence of frequency division ratios to provide an interpolated sequence of frequency division ratios at a rate corresponding to a PLL clock frequency, which is higher than the system clock frequency, wherein the interpolated sequence of division ratios corresponds to the ratio between the PLL clock frequency and the system clock frequency; and
supplying the interpolated sequence of frequency division ratios to the fractional-N multi-modulus frequency divider at the rate corresponding to the PLL clock frequency to adjust the frequency division ratio of the fractional-N multi-modulus frequency divider.

13. The method of claim 12, wherein the fractional-N multi-modulus frequency divider includes a modulator for modulating the interpolated sequence of frequency division ratios to obtain a modulated sequence of integer valued division ratios.

14. The method of claim 12, wherein the fractional-N multi-modulus frequency divider continuously adjusts an effective division ratio used by the PLL to accomplish a desired frequency modulation of the RF signal.

* * * * *